United States Patent
Kandler et al.

(10) Patent No.: US 9,733,298 B2
(45) Date of Patent: Aug. 15, 2017

(54) METHOD AND DEVICE FOR TESTING AN ELECTRONIC APPLIANCE

(75) Inventors: Marcus Kandler, Flörsbachtal (DE); Jan Michael Salziger, Esslingen (DE)

(73) Assignee: TAKATA AG, Aschaffenburg (DE)

( * ) Notice: Subject to any disclaimer, the term of this patent is extended or adjusted under 35 U.S.C. 154(b) by 1238 days.

(21) Appl. No.: 13/600,932

(22) Filed: Aug. 31, 2012

(65) Prior Publication Data

US 2013/0229191 A1    Sep. 5, 2013

Related U.S. Application Data

(63) Continuation of application No. PCT/EP2011/052665, filed on Feb. 23, 2011.

(30) Foreign Application Priority Data

Mar. 2, 2010  (DE) .......................... 10 2010 002 504

(51) Int. Cl.
*G01R 31/28*  (2006.01)
*G01D 3/08*  (2006.01)

(52) U.S. Cl.
CPC ............... *G01R 31/28* (2013.01); *G01D 3/08* (2013.01); *G01R 31/2829* (2013.01)

(58) Field of Classification Search
None
See application file for complete search history.

(56) References Cited

U.S. PATENT DOCUMENTS 6,087,826 A    7/2000  Donath
6,470,300 B1  10/2002  Benzinger et al.
(Continued)

FOREIGN PATENT DOCUMENTS

CN        1932469 A     3/2007
CN      101266278 A     9/2008
(Continued)

OTHER PUBLICATIONS

Japanese Office Action dated Aug. 18, 2015 in connection with Japanese Application No. 2012-555366, with English translation.
(Continued)

*Primary Examiner* — An Do
*Assistant Examiner* — Renee I Wilson
(74) *Attorney, Agent, or Firm* — Gordon & Rees LLP

(57) ABSTRACT

A method and a device for testing an electronic appliance for determining at least one variable of a system. The electronic appliance is designed in the form of a sensor. The method includes defining an expected minimum and/or maximum value of the variable and producing an electric signal by means of the electronic appliance depending on the variable. The method also includes detecting at least one value of a parameter of the produced electric signal and defining an expected minimum and/or maximum value of the parameter depending on the defined minimum and/or maximum value of the variable of the system. A determination is made, based on whether the detected value of the parameter is greater than the minimum value defined for the parameter and/or smaller than the maximum value, whether there is a malfunction of the electronic appliance provoked by an external electromagnetic interference field.

18 Claims, 4 Drawing Sheets

(56) References Cited

U.S. PATENT DOCUMENTS

| | | | |
|---|---|---|---|
| 8,138,772 B2* | 3/2012 | McDonnell | B60L 1/08 324/658 |
| 2005/0061057 A1 | 3/2005 | Lueck et al. | |
| 2006/0155515 A1 | 7/2006 | Buhl et al. | |
| 2007/0067078 A1 | 3/2007 | Salman et al. | |
| 2007/0194900 A1* | 8/2007 | Hawkins | B60N 2/002 340/457.1 |
| 2009/0267622 A1* | 10/2009 | Hansen | B60R 21/01532 324/684 |
| 2009/0295412 A1* | 12/2009 | Griffin | B60R 21/01516 324/681 |
| 2009/0295554 A1* | 12/2009 | Hansen | A47C 7/748 340/425.5 |
| 2010/0060296 A1 | 3/2010 | Jiang et al. | |
| 2010/0066355 A1 | 3/2010 | Krause et al. | |
| 2010/0253364 A1 | 10/2010 | Ganesh | |

FOREIGN PATENT DOCUMENTS

| | | |
|---|---|---|
| DE | 38 21 608 A1 | 12/1989 |
| DE | 43 30 345 C1 | 10/1994 |
| DE | 43 42 991 A1 | 6/1995 |
| DE | 198 18 860 A1 | 11/1999 |
| DE | 100 07 422 A1 | 9/2001 |
| DE | 101 62 689 A1 | 7/2002 |
| DE | 102 30 607 A1 | 2/2004 |
| DE | 102 42 128 A1 | 3/2004 |
| DE | 10 2004 042 731 A1 | 3/2006 |
| DE | 10 2004 051 018 A1 | 5/2006 |
| DE | 10 2006 048 604 A1 | 4/2008 |
| DE | 10 2007 049 022 B3 | 4/2009 |
| EP | 1 318 043 B1 | 2/2009 |
| EP | 2 163 861 A1 | 3/2010 |
| JP | 63-032318 | 2/1988 |
| JP | 63-148172 | 6/1988 |
| JP | 10-340122 | 12/1998 |
| JP | 2003-146196 | 5/2003 |
| JP | 2004-257388 | 9/2004 |
| WO | WO 95/16943 | 6/1995 |
| WO | WO-01/60663 | 8/2001 |

OTHER PUBLICATIONS

Notice of Reasons for Rejection dated Dec. 1, 2014 issued in Chinese Application No. 2012-555366, with English translation.
Office Action dated Sep. 3, 2014 issued in Chinese Application No. 201180012054.4, with English translation.
International Search Report PCT/EP2011/052665 dated Jul. 29, 2011.
German Examination Report mailed Mar. 11, 2016 issued in German Patent Application No. 10 2010 002 504.6; Filed Mar. 2, 2010.
European Examination Report mailed Aug. 30, 2016 issued in connection with European Application No. 11 709 030.8-1568.

* cited by examiner

METHOD AND DEVICE FOR TESTING AN ELECTRONIC APPLIANCE

CROSS-REFERENCE TO A RELATED APPLICATION

This application is a continuation of International Patent Application Number PCT/EP2011/052665, filed on Feb. 23, 2011, which was published in German WO 2011/107381. The foregoing international application is incorporated by reference herein.

BACKGROUND OF THE INVENTION

The invention relates to methods for testing an electronic appliance, which serves for determining at least one variable, as well as to a device for testing an electronic appliance for determining at least one variable.

Methods and devices to detect or simulate malfunctions of electronic appliances, e.g. in the form of sensors, are known from prior art. In particular, devices are known to keep interferences provoked by external electric sources of interference as low as possible, i.e. to obtain as good an electromagnetic compatibility (EMC) of the electronic appliance as possible.

However, it is hardly possible to entirely avoid interferences by external sources of interference, particularly, when the electronic appliance is movable. For example, the electronic appliance can be designed in the form of a sensor of a motor vehicle and, accordingly, be subjected to different external electromagnetic fields while driving.

SUMMARY OF THE INVENTION

The problem underlying the present invention is to develop a method and a device which allows for an operation as robust as possible of an electronic appliance.

According to an exemplary embodiment of the invention, a method for testing an electronic appliance for registering at least one variable of a (e.g. physical, particularly mechanical) system is provided, with the steps
a) Defining an expected minimum and/or maximum value of the variable;
b) Registering the variable of the system and producing an electric signal by means of the electronic appliance;
c) Detecting at least one value of at least one parameter (measured variable) of the produced electric signal;
d) Defining an expected minimum and/or maximum value of the parameter depending on the defined minimum and/or maximum value of the variable;
e) Testing whether the detected value of the parameter is greater than the minimum value defined for the parameter and/or smaller than the maximum value;
f) Determining on the basis of the result from step e) whether there is a malfunction of the electronic appliance.

Thus, based on a variable which can be registered with the electronic appliance and which is characteristic of the system, a range of plausibility is defined for a parameter of the electric signal produced by the electronic appliance when registering the variable of the system. To define this range of plausibility, first, a range of plausibility is defined for the variable which can be registered, which said range of plausibility particularly results from the intended application of the electronic appliance. Examples of (particularly physical) variables of the system and the defining of their range of plausibility will be discussed further below. It is pointed out that the steps a) to f), of course, do not necessarily have to be executed in this sequence. For example, defining an expected minimum and/or maximum value can also take place after registering the variable of the system and producing an electric signal by means of the electronic appliance.

The system is particularly formed in the form of a physical system, i.e. in the form of a system which has components standing in physical (particularly mechanical) interacting relation with each other. The invention is not, however, restricted to physical systems, but instead it can e.g. also be used with a chemical system. The "electric signal" particularly exists in the form of a voltage which can be tapped from the appliance or a current produced by the appliance.

For example, the minimum and/or the maximum value of the parameter are determined in that, based on a reference value (e.g. a mean value) of the parameter and depending on the registered variable, an expected maximum deviation of the parameter from the reference value is detected.

With the method according to the invention values of the parameters and the course of the parameters of the electric signal over time, respectively, can be classified specific to the application, wherein it can particularly be decided whether there is an interference of the electric signal, produced by the electronic appliance, by an external source of interference which generates e.g. an electric interference field or whether there is a malfunction provoked by a defect of the electronic appliance. In particular, with the method according to the invention, it can be avoided that, on the basis of a value of the parameter which does indeed deviate far from a reference value but is still plausible with regard to the specific application of the electronic appliance, it is falsely concluded that there is a defect of the electronic appliance.

It is pointed out that the electronic unit which is to be tested can also be a part (e.g. a microchip) of a greater electronic circuit and an "external electromagnetic interference field," which acts on the electronic appliance, can e.g. also be provoked by another part of the electronic circuit.

Of course, the "external electromagnetic interference field" can also be produced by a source which is arranged independently of the electronic circuit containing the electronic appliance which is to be tested and which said source is located for instance outside of a casing in which the electronic circuit is housed together with the electronic appliance. The electromagnetic interference field reaches the electronic appliance e.g. via a galvanic connection or as an electromagnetic wave.

In an exemplary embodiment of the invention the minimum and/or the maximum value of the parameter are determined in that, based on a reference value of the parameter, an expected maximum deviation of the parameter from the reference value is detected. For example, the reference value of the parameter is detected with an at least approximatively constant variable of the system, i.e. in a stationary state of the variable and without the influence of a source of interference. Thus, in a way, a "calibration" of the electronic appliance takes place, so that it can be concluded that there is an external interference field, when the determined parameter of the electric signal deviates further from the reference value than can be expected with regard to the considered application of the electronic appliance.

For example, the electronic appliance is a displacement sensor, which is not or only insufficiently shielded against an external source of interference, for detecting a change of displacement of a movable part, wherein the displacement sensor produces an electric signal, the amplitude of which depends on the position of the movable part. The result of the intended use of the displacement sensor is now for instance that the change of displacement which shall be measured with the displacement sensor cannot take place with an arbitrary speed, but instead, according to the application, there exists a range in which the speed of the change of displacement will or has to lie. Based on this range of speed a range can be defined, in which e.g. the speed, with which an amplitude of an electric signal produced by the displacement sensor changes, will lie. When the speed of the amplitude change lies outside of this range, there is a malfunction.

Thus, specific to the application, a range of plausibility for the variable of the system and, derived from this, a range of plausibility for one or multiple parameters of the electric signal can be defined. In this context it is pointed out that a "variable of the system" is also understood to be the change of a variable over time, i.e. in the example above the change of displacement is viewed as a distinct variable. Correspondingly, a change of a parameter over time is also viewed as a distinct parameter, e.g. the change of the signal amplitude over time (derivative) is treated as a distinct parameter.

To determine a reference value for the speed of the amplitude change of the electric signal the movable part can e.g. be moved with a constant and, for the use of the movable part, pre-determined speed and the corresponding electric signal can be registered and the parameter can be determined in the form of the signal amplitude. In order to detect particularly an upper limit for the speed of the change of the signal amplitude the movable part is moved as fast as the use of the movable part determines or permits.

It is obviously possible that more than one parameter, e.g. a first and a second parameter, of the electric signal is detected depending on the variable of the system which is to be registered with the appliance which is to be tested. For example, the first parameter can be the real part and the second parameter the imaginary part of the electric signal produced by the electronic appliance, i.e. the amplitude and the phase of the signal are determined and, based on the definition of the limits of the variable which is to be registered, corresponding limits are defined for the amplitude and the phase.

It is possible that parameters can, within their plausibility limits (i.e. the expected minimum and/or maximum values), assume values independently of each other. It is, however, also conceivable that the parameters depend on each other. In particular, depending on the variable of the system which can be registered, an expected range of values can be defined for the first and the second parameter, which results from a functional correlation between the first and the second parameter so that exactly one value of the second parameter is allocated to each value of the first parameter.

For example, there is a linear correlation between the two parameters so that the plausible values of the first and the second parameter form coordinates of a straight line in a coordinate system spanned by the two parameters. The method according to the invention can now provide that it is also tested whether or not the detected values of the parameter (e.g. detected at different points in time) appertain to the defined range of values.

According to another exemplary embodiment of the method according to the invention
the steps a) to e) are performed for a first variable of the system; and
depending on the result for the first variable the steps a) to f) are performed for a second variable of the system and for a second parameter, wherein the second variable is different from the first variable and according to step d) a minimum and/or maximum value of the second parameter is determined depending on the defined minimum and/or maximum value of the second variable.

Accordingly, a hierarchical (taxonomic) test of the electronic appliance is performed. This hierarchical test takes place for instance in such a way that, when after the first run through the steps of the method a) to e) the result is that the first parameter lies outside of the plausible range, a further test takes place on the basis of another parameter, the plausibility limits of which are defined on the basis of another variable which can be registered.

It is pointed out that in this context one can also speak of different variables of the system when the two variables do indeed refer to the same physical variables (e.g. a speed), however, the variables relate to e.g. different parts or states of the system, e.g. the "first variable" of the system can refer to the speed with which a vehicle occupant moves out of a vehicle seat and the "second variable" to a speed with which a vehicle occupant moves into the seat. Of course, "different variables" of the system can also refer to different physical variables.

In an example the first parameter is an amplitude of the electric signal and the second parameter is a change of the amplitude of the electric signal over time. According to this, it is first tested whether the detected signal amplitude lies within its plausibility limits. Should this not be the case, a further testing takes place on the basis of the speed with which the amplitude changes. It is conceivable that an external interference field (for instance, an approximatively static field) does indeed influence the signal amplitude but not the change of the signal amplitude over time (i.e. the time derivative of the signal amplitude), so that when the signal amplitude but not the change of the signal amplitude does indeed lie outside of the respective plausibility limits it can be concluded that there is an external interference field present (and not a defect of the electronic appliance).

It is of course also possible that depending on the first and the second variable expected minimum and/or maximum values are determined for two parameters each, i.e. for the first and a first further parameter a minimum and/or maximum value is determined depending on the first variable and for the second and a second further parameter a minimum and/or maximum value is determined depending on the second variable.

For example, the real and the imaginary part (i.e. amplitude and phase) of the electric signal, respectively, or parameters depending on the real and imaginary part of the electric signal, respectively, are determined as parameters.

For example, the two parameters, the expected minimum and/or maximum values of which are determined depending on the first variable of the system (i.e. the first and the first further parameter), are the real and the imaginary part of the electric signal determined by means of the electronic appliance, and/or the two parameters, the expected minimum and/or maximum values of which are determined depending on the second variable (the second and the second further parameter), are the change of the real and the imaginary part of the electric signal over time. In particular, in order to detect the respective real and imaginary part the amplitude and the phase and, respectively, the change of these variables over time are determined.

According to a further exemplary variant of the invention, at least one further electronic appliance is provided, which is designed analogous (particularly identical) to the electronic appliance which is to be tested, wherein depending on the result of step e) the steps a) to f) are performed with the further electronic appliance (i.e. particularly, when the detected values lie outside of the range of plausibility). When the result of the testing with the second electronic appliance likewise shows that the parameter lies outside of its range of plausibility, it can very surely be concluded that there is an interference by an external electromagnetic source and not a defect of the electronic appliance which is to be tested. Of course, more than one further electronic appliance can be provided.

To make sure whether there is in fact merely an interference by an external source of interference, a (conventional) circuit testing of the electronic appliance can be initiated, e.g. a continuity test, in case the parameter values lie outside of the defined limits. Such a circuit testing is initiated e.g. when the difference between a value of the parameter determined with the electronic appliance which is to be tested and a value of the parameter determined (at the same point in time) with the further electronic appliance exceeds a pre-determinable limit value.

It is also conceivable that instead of a further electronic appliance, which is designed analogous to the electronic appliance which is to be tested, a different kind of reference circuit is provided, e.g. in the form of a simple RC element. With this reference circuit the steps a) to f) are then performed when the parameter, detected with the electronic appliance which is to be tested, lies outside of the range of plausibility. In particular, instead of a further electronic appliance the device according to the second aspect of the invention, specified further below, can also be employed.

In a further exemplary embodiment of the invention the electronic appliance which is to be tested is a sensor, which is designed e.g. for determining an occupancy of a vehicle seat by a vehicle occupant. Such sensors are particularly configured as part of a vehicle seat and are connected to an evaluation unit for analyzing an electric signal, which they produce on account of an interaction of the vehicle occupant with the vehicle seat.

For example, such a sensor is designed in the form of a capacitive sensor which is particularly loaded with an AC voltage. As parameters of the electric signal produced with the sensor e.g. the active current portion (that is, the portion or real part of the alternating current which is in phase with the supplied AC voltage), particularly as a basis for determining a phase shift, and/or the reactive current portion (the imaginary part of the alternating current) and/or the quadrature portion or effective value of the current, particularly as a basis for determining the amplitude, are detected.

The variable of the system (i.e. of the system vehicle seat—vehicle occupant) which can be registered by such a sensor is e.g. a speed with which the vehicle occupant moves into, out of or on the vehicle seat. It is pointed out that using the phrase that a variable is "registered" does not necessarily mean that the main purpose of the sensor has to be determining this variable, but merely that the variable is determinable (at least qualitatively) by means of the sensor signal and can presently be used for the plausibility check of the sensor signal.

In particular the speed with which the vehicle occupant moves into or away from the seat influences the speed with which a parameter, determined with the sensor, changes, for instance, the change of the amplitude (or of the quadrature portion of the sensor signal) over time depends on the speed of the vehicle occupant while sitting down or standing up. Obviously, other parameters can also depend on the speed of the vehicle occupant in relation to the vehicle seat, e.g. also the reactive current portion of the sensor signal.

As the vehicle occupant cannot move into or out of the seat arbitrarily fast and also not arbitrarily slow, a minimum and a maximum value can be specified for the speed with which he moves into and/or out of the vehicle seat. Based on these limit values, in turn, minimum and maximum values of the parameters (e.g. for the reactive current and the quadrature portion) of the electric signal produced with the sensor can be specified.

In the case of a vehicle seat sensor the variable registered by the sensor can e.g. also be the amount of a force (or of a change of displacement of a seat part, e.g. the seat surface), with which the vehicle occupant moves into or out of the vehicle seat or acts on the vehicle seat while sitting. Particularly the amplitude of the sensor signal can depend on this force, so that by defining a plausible range for this force a range of plausibility for the signal amplitude can be defined. It is, however, e.g. also possible that the seat sensor (particularly when using a capacitive sensor) registers the amount or a change of an electric field in the area of the seat instead of a force or a change of displacement.

Obviously, the invention is not restricted to vehicle seat sensors, but instead e.g. also other kinds of sensors can be tested, e.g. air bag sensors, temperature sensors (i.e. sensors, which do not necessarily register mechanical variables) or e.g. also occupancy sensors of a steering wheel (steering wheel sensors) which monitor a contacting of the steering wheel by the driver of the vehicle. The invention is, however, also not restricted to being able to test electronic appliances in the form of a sensor, but instead the method according to the invention can be used with electronic appliances which can basically be configured at will, e.g. in the form of a hardware component of a programmable device. In general, e.g. an amplitude, a frequency or a phase of the electric signal or a change of these variables are used as parameters of the signal produced with the electronic appliance.

According to a second exemplary aspect, the invention also relates to a method for testing an electronic appliance for registering at least one variable of a system (particularly a physical one, as explained above), with the steps:
a) Producing a first, pre-determined electric reference signal and a second, pre-determined electric reference signal;
b) Determining at least one first value of at least one first parameter of the first electric reference signal and at least one first value of a second parameter of the second electric reference signal;
c) Defining an expected minimum and/or maximum value of the first and the second parameter;
d) Testing whether the first and/or the second value is greater than the minimum value and smaller than the maximum value;
e) Determining on the basis of the result from step e) whether there is a malfunction of the electronic appliance (particularly by a source of interference present outside of the electronic appliance).

The first and the second reference signal are particularly produced by means of a first and a second reference circuit, wherein it is pointed out that obviously also more than two reference signals can be used.

According to this, the electronic appliance which is to be tested is not necessarily included in the testing method, but instead the test whether there is an interference by an external source of interference takes place by means of at least one first and one second reference circuit. The reference circuits are particularly loaded with an AC voltage, so that e.g. the parameters (e.g. quadrature portion and reactive current), explained further above, of the electric signal produced by the reference circuits can be determined. Generally, as explained above, parameters in the form of an amplitude, a frequency or a phase of the electric signal or a change of these variables are considered here also.

For example, the reference circuits are configured differently (particularly more simple) than the electronic appliance which is to be tested (which can e.g. be a sensor, as specified above), e.g. in the form of an RC element or an RL element.

It is, however, of course also conceivable that the first and/or the second circuit is designed analogous to the electronic appliance for determining a variable which is to be tested and the minimum and/or maximum value of the parameter is determined depending on a defined minimum and/or maximum value of the variable of the system (e.g. in the form of one of the variables mentioned in relation to the first aspect of the invention).

Obviously, the steps of the method according to the invention can each be formulated in the form of a program, which can be executed on a programmable appliance. In this manner, a software-implemented EMC filter according to the invention can be realized.

The invention also relates to a device for testing an electronic appliance for determining at least one variable of a system, having
    Detecting means to detect at least one value of a parameter of an electric signal produced by means of the electronic appliance;
    Defining means to define an expected minimum and/or maximum value of the parameter depending on a minimum and/or maximum value of the variable, which is determinable by means of the electronic appliance;
    Testing means to test whether a value of the parameter detected by the detecting means is greater than the minimum value defined by the defining means and/or smaller than the defined maximum value;
    Determining means to determine on the basis of a signal of the testing means, whether there is a malfunction of the electronic appliance, particularly, whether there is an interference caused by a source of interference present outside of the electronic appliance.

The defining, the testing and/or the determining means are particularly designed in the form of a programmed appliance; e.g. in the form of a microchip, an ASIC or as part of an ECU of a motor vehicle.

The device can, furthermore, also have correcting means which serve to correct an electric signal of the electronic appliance (designed e.g. in the form of a sensor) depending on the detected characteristic value or the multiple detected characteristic values to, as far as is possible, eliminate or at least reduce the influence of an external field on the sensor signal. Such a device thus works as EMC filter.

In a further exemplary aspect, the invention also relates to a device for testing an electronic appliance for determining at least one variable of a system, having
    Signal producing means to produce at least one first and one second reference signal;
    Detecting means to detect at least one first value of at least one first parameter of the first electric signal and at least one second value of at least one second parameter (i.e. of a parameter different from the first parameter) of the second electric signal as well as a difference between the first and the second value;
    Defining means to define an expected minimum and/or maximum value of the difference between the first and the second value;
    Testing means to test whether the difference is greater than the minimum value and smaller than the maximum value;
    Determining means to determine on the basis of a signal of the testing means whether there is a malfunction of the electronic appliance, particularly, whether there is an interference caused by a source of interference present outside of the electronic appliance.

In particular, the signal producing means have a first and a second reference circuit to produce the first and the second reference signal, respectively.

This device is particularly designed to perform a method according to the second aspect of the invention, i.e. the reference circuits are particularly configured differently than the electronic appliance which is to be examined, e.g. in the form of a simple circuit, for instance an RC element, a Hall sensor or an ASIC.

The defining, the testing and/or the determining means also of this aspect of the invention can, of course, particularly be designed in the form of a programmed appliance and can particularly form a unit together.

This device also can likewise have correcting means to realize an EMC filter. In particular, the correcting means are designed to correct an electric signal of the electronic appliance depending on the first and/or the second reference signal.

BRIEF DESCRIPTION OF THE DRAWINGS

The invention will subsequently be further explained on the basis of exemplary embodiments with reference to the figures.

DETAILED DESCRIPTION

Figure 1:
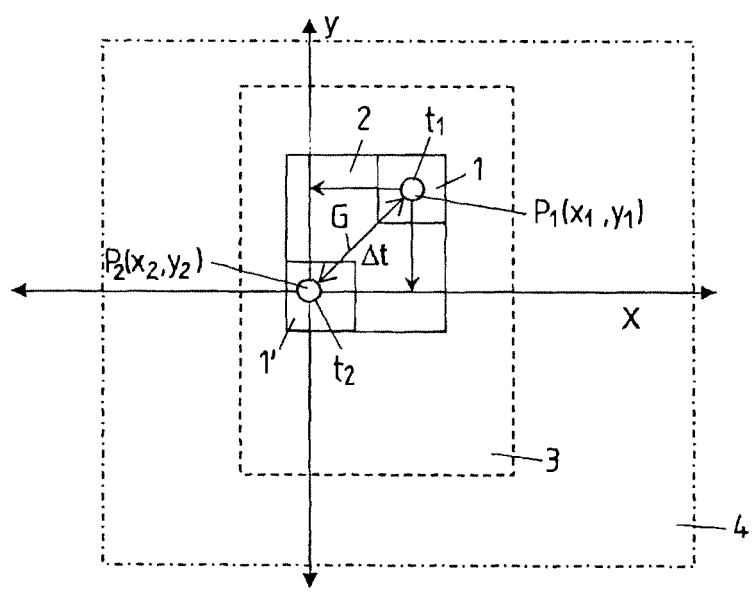
FIG. 1 schematically shows the classification of parameters of an electric signal according to a first exemplary embodiment of the invention.

FIG. 1 shows a coordinate system in which values $(x_1, x_2)$ of a first parameter X and values $(y_1, y_2)$ of a second parameter Y of an electric signal, produced by an electronic appliance which is to be tested, are plotted. For example, the first parameter is a quadrature portion of an alternating current signal produced by the electronic appliance and the second parameter is a reactive current of the alternating current signal. The electronic appliance under consideration is particularly designed in the form of a sensor which is correspondingly loaded with an AC voltage.

At a first point in time $t_1$ the system, to which the electronic appliance which is to be tested is allocated, is in an approximatively stationary state, so that variables of the system fluctuate only slightly around a stationary value. Based on the concrete application of the electronic appliance, i.e. of the system allocated to it which is designed in the form of a physical system in the example of FIG. 1, and its use, lower and/or upper limits of variables of the system can be specified for the stationary state which characterize a range of plausibility, valid for the stationary state, in relation to the respective variable.

This, in turn, allows for the specification of lower and/or upper limits of the parameters which can be detected with the electronic appliance, so that a "stationary" range of plausibility 1 can be specified, in which the values of the parameters will be as long as the system is in the stationary state and there is no malfunction of the electronic appliance. When at least one of the parameters falls out of the range 1 this does not, however, inevitably have to mean that there is a malfunction, but instead it can also be merely produced on account of the physical system changing from the stationary state into a dynamic state.

For example, the electronic appliance is a vehicle seat sensor, which, as already mentioned above, serves to detect an occupancy of a vehicle seat by a vehicle occupant, i.e. the "physical system" to which the vehicle seat sensor is allocated, comprises the vehicle seat and the vehicle occupant. In a stationary state of this system of vehicle seat and vehicle seat the vehicle occupant is on the vehicle seat (and not in the seat, respectively), wherein, nevertheless, certain movements of the vehicle occupant will take place on the vehicle seat, so that the detected parameters will also have certain temporal fluctuations.

A lower and an upper limit of such fluctuations can now be specified by defining a lower and an upper limit for at least one variable of the system vehicle seat—vehicle occupant influencing these parameters. For example, a maximum deflection of the seat surface can be specified, which a vehicle occupant positioned on the vehicle seat can provoke. This maximum deflection of the seat surface limits e.g. the amplitude of the electric signal, i.e. in the present example the value of the first parameter. Analogously, for the stationary case, a lower limit for the second parameter and a lower and an upper limit for the first parameter can be defined. The detected parameters can therefore be classified according to whether or not they lie within the plausibility limits, i.e. within the range 1. When they lie in this range, it can be concluded from this that the physical system under consideration is in a stationary state. In particular, values of the parameters are detected at multiple moments in time, e.g. virtually continuously.

Analogous to the stationary state of the physical system minimum and/or maximum values of at least one variable of the system can be specified, also for a dynamic state of the system in which variables of the system change over time, which said minimum and/or maximum values this variable most probably cannot or will not fall below or exceed due to the properties of the system. Based on these minimum and/or maximum values limits for the first and the second parameter can be specified, which characterize the dynamic state of the physical system. The range of plausibility defined in this way is designated as range "2" in Figure. When at least one of the two parameters leaves the range 2, it can be assumed that there is an interference by an external source of interference.

In the example of a physical system consisting of a vehicle seat and a vehicle seat sensor a dynamic state of the system particularly consists in the vehicle occupant moving out of or into the vehicle seat. Both movements of the vehicle occupant are characterized by a minimum and a maximum force action onto the seat, so that analogously to the stationary state lower and upper limits for the values of the first and the second parameter can be specified, which define the range 2 in FIG. 1.

According to FIG. 1, at a point in time $t_2$, the system is again in a stationary state, e.g. the vehicle occupant has at this point in time risen entirely from the seat. This state is characterized by the point $P_2$ in the X-Y-coordinate system, i.e. by a corresponding pair of values of the first and the second parameter. A stationary range 1' extends around the point $P_2$, which does not necessarily have to have the same "dimensions" as the stationary range 1 at the point in time $t_1$.

In addition to the first variable, e.g. the force action of the vehicle occupant onto the vehicle seat, the dynamic state of the physical system can be determined by one or multiple further variables, which affect the signals determined by the electronic system. Based on these further variables lower and upper limits can be specified for further parameters, which can likewise be used to classify the parameters.

For example, in the case of the vehicle seat sensor, also a speed can be specified with which the vehicle occupant moves out of or into the seat, below which one cannot fall and which cannot be exceeded. Analogously, based on the minimum and maximum vehicle occupant speed, lower and upper limits for the change of the first and the second parameter over time can be specified, i.e. a lower and an upper limit for the speed with which e.g. a quadrature portion of the electric signal changes and a lower and an upper limit, with which a reactive current portion of the electric signal changes, can be specified.

In FIG. 1 the time which passes to convert the first and the second parameter ($x_1$, $y_1$) at the point in time $t_1$ into the second parameter ($x_2$, $y_2$) at the point in time $t_2$, i.e. to the point $P_2$, is indicated with "$\Delta t$." The smaller $\Delta t$ the greater is the rate of change of the first and the second parameter. The temporal dependence of the parameters could also be illustrated by expanding the coordinate system, shown in FIG. 1, by a time dimension, i.e. expanding it from a two-dimensional to a three-dimensional illustration.

In particular, whether there is a malfunction cannot only be tested on the basis of one criterion, e.g. the limits of the range 2, but instead a further criterion, namely the speed with which the parameters change, can be used. In particular, the test can take place hierarchically, so that only when one of the criteria is not met, a testing on the basis of the second criterion also takes place. For example, it is only tested whether the speed with which a parameter changes lies in its range of plausibility, when it has been established that at least one parameter has left the range of plausibility 2, i.e. that e.g. the signal amplitude is greater than it can be expected.

Of course, further variables which characterize the physical system and/or the electric appliance can be used. For example, the physical system and the appliance which is to be tested can be configured and be arranged relative to each other in such a way that parameters of the electric signal depend on one another, wherein there can particularly be a functional correlation, so that a value of the second parameter is clearly allocated to a value of the first parameter. In the example of FIG. 1, for instance, the values of the first and the second parameter, which can be expected in the dynamic state of the physical system, lie on a straight line G. Additionally, it can now be tested whether or not the first and/or the second parameter appertains to the range of values defined by the straight line G (i.e. whether the measured values correspond to the expected "direction" of the change). Obviously, the functional correlation between the first and the second parameter X, Y does not have to be linear but it can generally be formed by a curve in the X-Y space.

The gravity of the malfunction can be further classified by further limits for the first and the second parameter. According to FIG. 1, for this purpose the additional ranges 3 and 4 are defined. In particular, the limits of the range 4 can be set in such a way that there has to be a hardware defect and not just EMC interference when parameters fall into this range.

Figure 2:
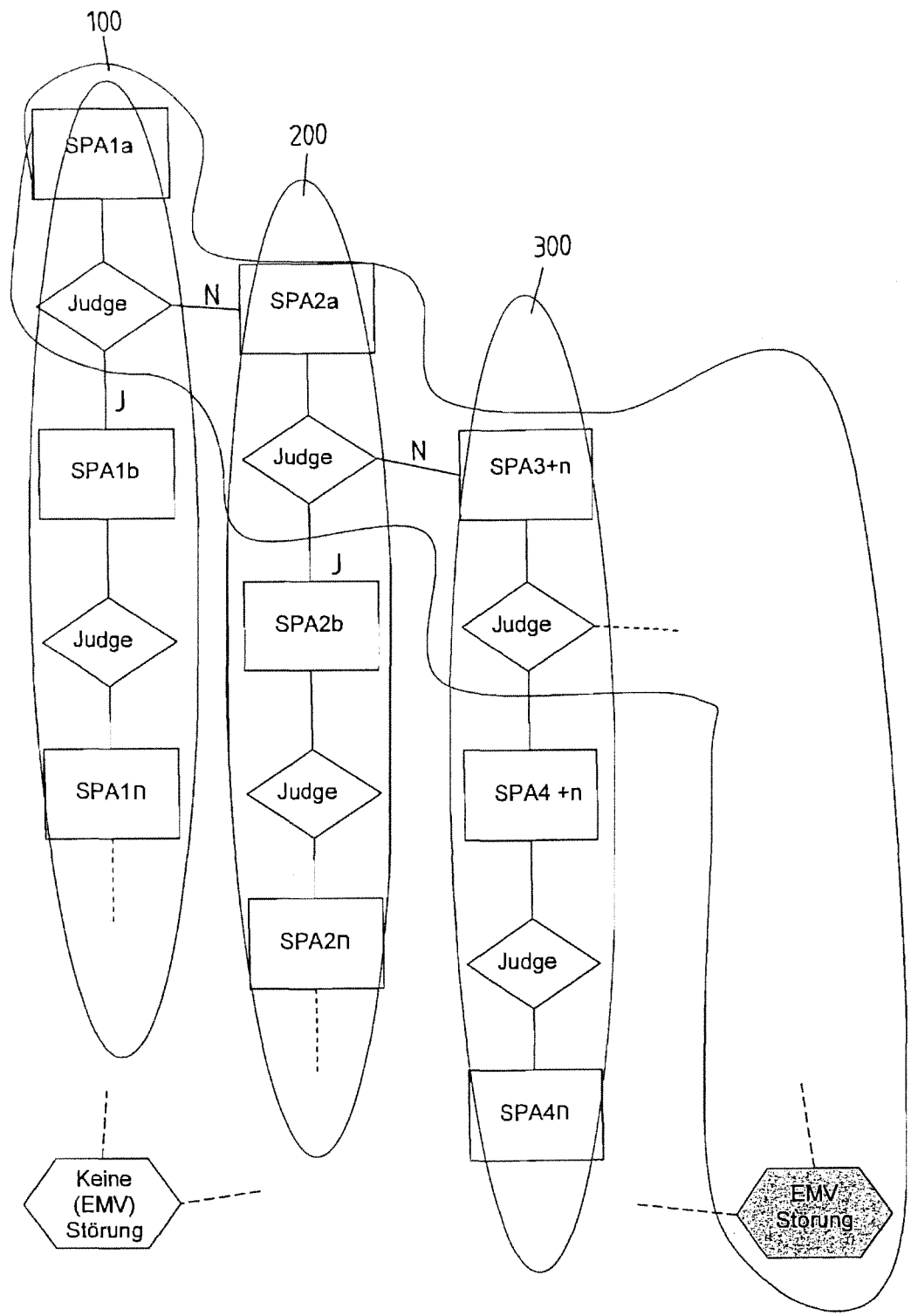
FIG. 2 shows a flow chart for a testing method according to a second exemplary embodiment of the invention.

FIG. 2 illustrates a further exemplary embodiment of the invention, according to which hierarchically different parameters are tested for plausibility on the basis of different criteria to test the electronic appliance.

First, in a first step "SPA1a," it is tested within a first line of decision 100 whether a first parameter lies within a first range of plausibility, wherein "SPA" stands for the principle underlying the invention, namely the "signal analysis of a physical application limit." For example, the first parameter is the change of a parameter over time, for instance the signal amplitude. The range of plausibility was defined, as explained above, depending on limits of the underlying variable, e.g. the speed with which a vehicle occupant moves into a vehicle seat (i.e. from a start point A to an end point B). In other words, for a first variable of the physical system vehicle occupant-vehicle seat, namely the time the vehicle occupant can minimally need to move into the seat, i.e. move from A to B, a plausibility value in the form of a lower limit $t_{min}$ is defined.

Furthermore, for a second variable of the physical system vehicle occupant-vehicle seat, namely the time the vehicle occupant can maximally need to move into the seat, a second plausibility value in the form of an upper limit $t_{max}$ is determined. Instead of the times $t_{min}$ and $t_{max}$ e.g. the difference $\Delta t_{min/max} = t_{max} - t_{min}$ can also be used as the plausibility value which is to be underlying.

Depending on $t_{min}$ or $t_{max}$ and $\Delta t_{min/max}$, respectively, an expected minimum and maximum value of the parameters X, Y and thus the range of plausibility 2 is defined.

When the parameter does not lie within the range of plausibility, the same variable is tested in a step "SPA1b" on the basis of another criterion, for instance, by testing whether the parameter does not lie in the range of plausibility which results from the speed with which a vehicle occupant moves out of the vehicle seat. In other words, analogous to the above case "SPA1a" a lower and an upper limit $t_{min}'$ and $t_{max}'$ are specified for a movement of the vehicle occupant from a start point B' (vehicle occupant is in the seat) to an end point A', wherein the points A', B' do not necessarily have to be identical with the points A, B of the case "SPA1a."

When the criterion "SPA1b" is likewise met, a further criterion ("SPA1n") can be queried, wherein the number of the criteria used within the line of decision 100 can basically be arbitrary and will be selected specific to the application. When one of the criteria of the first line of decision 100 is not met, one can go on to a second line of decision 200 which refers e.g. to another class of the variables of the physical system used to set the plausibility limits. For example, the line of decision 200 refers to the electric field strength in the vicinity of the seat sensor. For this field strength, analogous to the above cases "SPA1a" and "SPA1b," plausibility limits can be defined, from which corresponding plausibility limits of one or multiple parameters of the sensor signal can be derived.

For example, the amplitude of the sensor signal depends on the field strength in the vicinity of the seat, so that based on the definition of plausibility limits for the field strength plausibility limits for the signal amplitude can be defined, that is, likewise for the cases "vehicle occupant moves into the seat" ("SPA2a") and "vehicle occupant moves out of the seat" ("SPA2a"). These criteria, i.e. the testing whether the characteristic values of the sensor lie in the respective range of plausibility, can now be run through analogous to the line of decision 100.

For example, on the basis of the number or the kind of criteria met, a judgement can be made whether or not there is EMC interference. Presently it is possible for instance, that an EMC interference can be ruled out with high probability when all the criteria of the second line of decision 200 have been met, even though at least one other characteristic value has been lying outside of the plausibility limits of the first line of decision 100, i.e. at least one other criterion of the first line of decision has not been met.

Of course, further lines of decision (e.g. a line of decision 300) can follow the first and the second line of decision, wherein the number of lines of decision can basically be selected at will. It is pointed out that FIG. 2 is obviously only an example. The invention comprises basically any kind of hierarchical query sequences.

Figure 3:
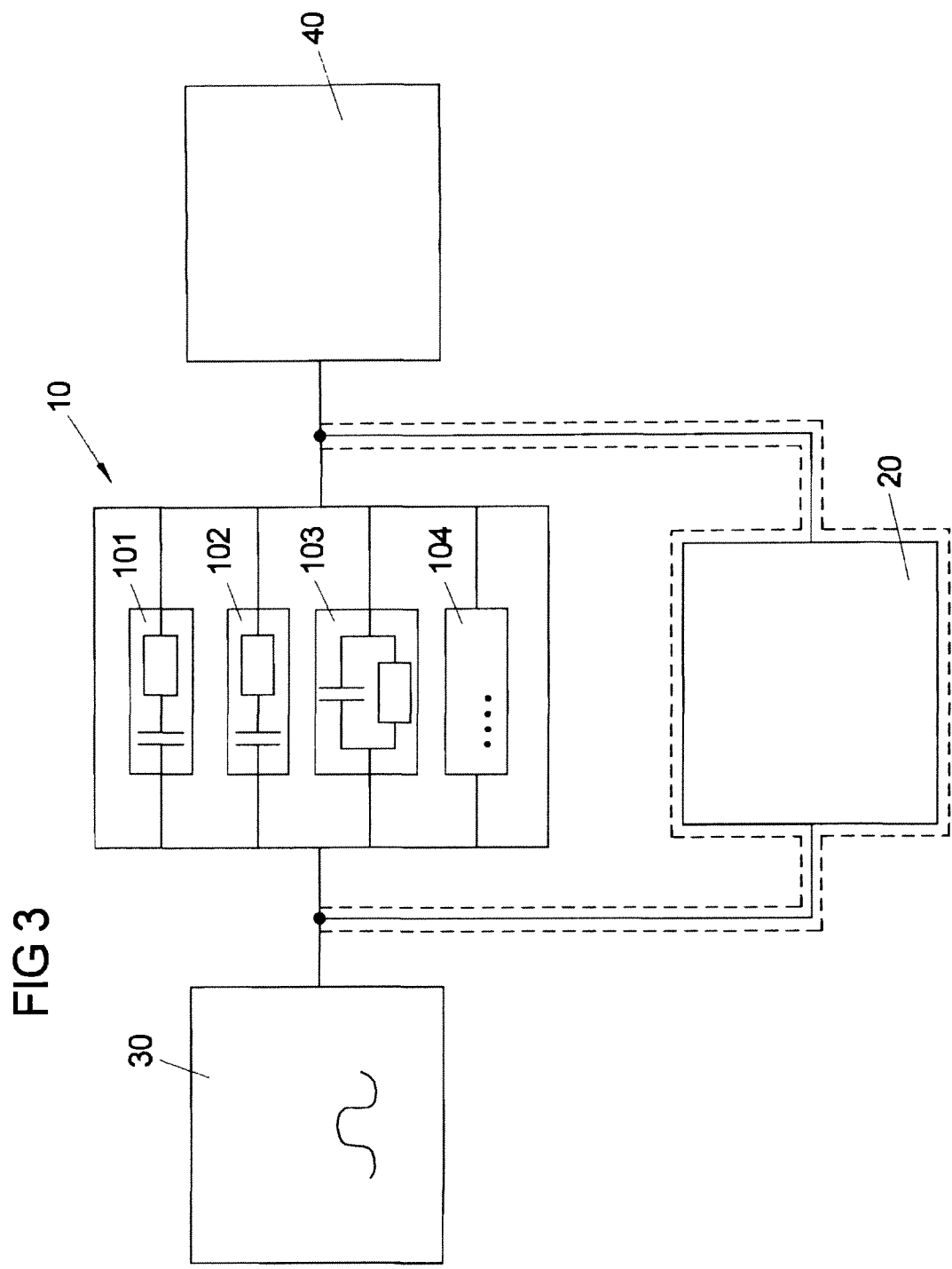
FIG. 3 shows a schematic illustration of a device according to an exemplary embodiment of the invention.

FIG. 3 refers to a device according to a second aspect of the invention. A device 10 for testing an electronic appliance in the form of a sensor 20 has a plurality of reference circuits 102-104, wherein the number of reference circuits can basically be arbitrary.

The device 10 is supplied with an AC voltage via an AC voltage source 30, wherein the AC voltage source 30 also serves to supply the sensor 20. On an outlet of the device 10 an electric signal in the form of an AC output voltage is tapped by an evaluation unit 40.

The reference circuits 102-104 can basically be configured at will, for instance in the form of RC, LC or RLC elements. However, the invention is, of course, not restricted to this kind of reference circuits, but instead reference signals can be used, which can be produced by basically any kind of source. The electric signal, produced by the device, which is tapped by the evaluation unit, can particularly be influenced by a source of interference (not illustrated) which is arranged externally to the device 10 and to the sensor 20, so that an analysis of the output signal allows the conclusion that there exists of a source of interference. Thus, with an analysis of the signals of the reference circuits 102-104 it can be seen whether an output signal generated by the sensor, which said output signal is e.g. likewise led to the evaluation unit 40, is only distorted by an external interference, or whether there is a sensor defect. It is also possible to correct a sensor signal on the basis of the signal of the reference circuits 102-104.

The evaluation unit 40 particularly comprises detecting means to detect at least one first value of a parameter of a first electric signal produced with the first reference circuit 101 and at least one second value of a parameter of a second electric signal produced with the second reference circuit 102. For example, the parameter is the quadrature portion of the output signal which is detected for the output signal of the first and the second sensor, respectively. The detecting means, correspondingly, can also detect values of the parameter for the output signals of the remaining reference circuits. The detecting means, furthermore, detect a difference between the first and the second value of the parameter.

Furthermore, the evaluation unit comprises defining means to define an expected minimum and/or maximum value of the difference between the first and the second value of the parameter, detected by the detecting means, as well as testing means to test whether the difference is greater than the minimum value and smaller than the maximum value. By means of a signal of the testing means, determining means of the evaluation unit finally determine whether there is an interference of the electronic appliance by an interference field produced outside of the electronic appliance. In particular, the evaluation unit recognizes a fault, when the difference is smaller or greater than the defined minimum and maximum values.

In particular, the difference of the first and the second value is detected at multiple points in time and the plausibility is tested, respectively. In a variant the differences detected at a number of succeeding points in time are added up and the resulting sum is compared with correspondingly fitted minimum and maximum values.

The evaluation unit, i.e. particularly its detecting means, determining means and testing means, can additionally detect further differences and use them for analysis, e.g. differences between values which were determined with the first and the third reference circuit 101, 103 or with the second and the third reference circuit 102, 103, etc.

Figure 4:
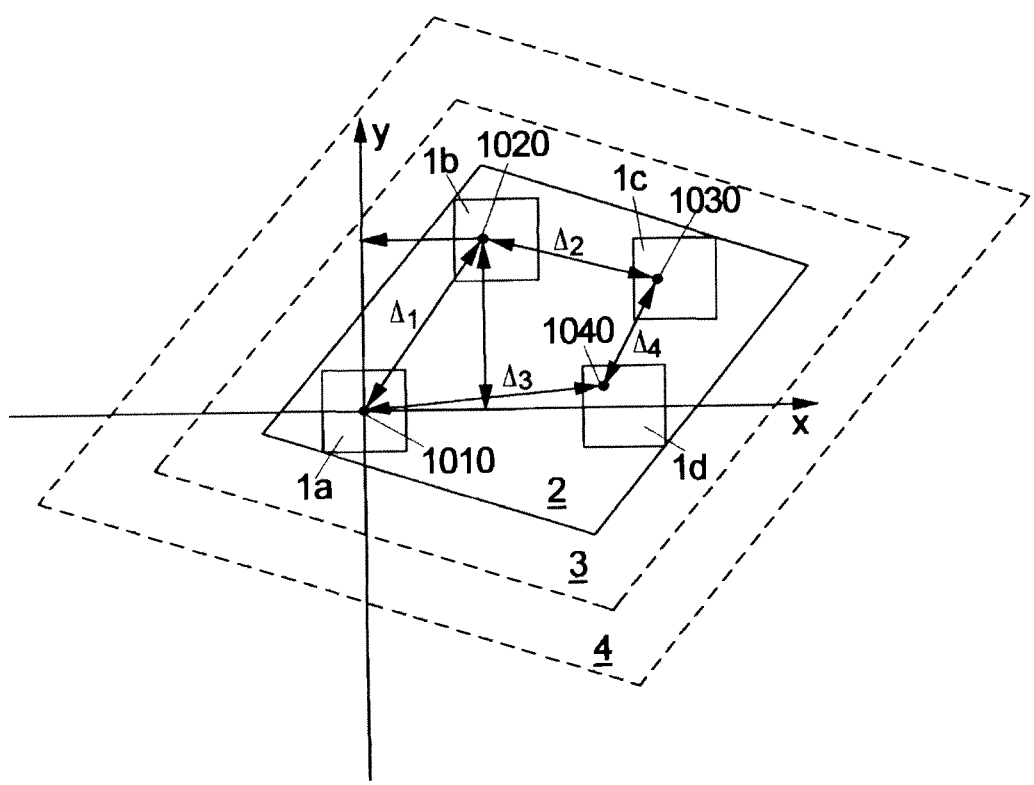
FIG. 4 schematically shows the classification of parameters of an electric signal produced by the device from FIG. 3.

FIG. 4 illustrates the detecting of the signal parameters with the device from FIG. 3, wherein, as in FIG. 1, a first and a second parameter x, y are plotted.

According to this, four reference signals are produced (e.g. with the reference circuits 101-104 from FIG. 3), wherein a point 1010, 1020, 1030, 1040 (i.e. two parameters each) in the X-Y-coordinate system is allocated to each of these reference signals. For the EMC testing particularly the differences $\Delta_1$, $\Delta_2$, $\Delta_3$, $\Delta_4$ of the parameters 1010, 1020, 1030, 1040 are considered.

Analogous to FIG. 1 a "stationary" range 1 can be specified for the parameters 1010, 1020, 1030, 1040. Furthermore, a range of plausibility 2 can be defined for the parameters 1010, 1020, 1030, 1040 themselves or for the differences $\Delta_1$, $\Delta_2$, $\Delta_3$, $\Delta_4$ of the parameters, in which the parameters will be when there is no interference by an external field. Equally, further ranges 3, 4 can be displayed in the X-Y diagram, which allow e.g. for a classification of the EMC interference and/or a rating of the malfunction as a hardware defect.

It is pointed out that it is, of course, also conceivable to also include the signal of the sensor 20 which is to be monitored in the analysis, in addition to the reference signals of the reference circuits 101-104, so that the diagram of FIG. 4 would include at least one further parameter of the sensor signal.

The priority application, German Patent Application Number 10 2010 002 504.6; filed Mar. 2, 2010 is incorporated by reference herein.

The invention claimed is:

1. A method for testing an electronic appliance for registering at least one variable of a system, wherein the electronic appliance is designed in the form of a sensor, with the steps:
   (a) Defining an expected minimum and/or maximum value of the variable;
   (b) Registering the variable of the system and producing an electric signal by means of the electronic appliance depending on the registered variable;
   (c) Detecting at least one value of a parameter of the produced electric signal;
   (d) Defining an expected minimum and/or maximum value of the parameter depending on the defined minimum and/or maximum value of the variable of the system;
   (e) Testing, whether the detected value of the parameter is greater than the minimum value defined for the parameter and/or smaller than the maximum value;
   (f) Determining on the basis of the result from step e), whether there is a malfunction of the electronic appliance provoked by an external electromagnetic interference field,
   the steps (a) to (e) are performed for a first variable of the system; and
   depending on the result for the first variable the steps (a) to (f) are performed for a second variable of the system and a second parameter, wherein the second variable is different from the first variable and according to step (d) a minimum and/or maximum value of the second parameter is determined depending on the defined minimum and/or maximum value of the second variable; and
   the steps (a) to (f) are performed for the second variable only if a first parameter of the first variable is smaller than the minimum value or greater than the maximum value.

2. The method according to claim 1, wherein values of a first and a second parameter of the electric signal are detected.

3. The method according to claim 2, wherein the first parameter is the real part of the electric signal or depends on the real part and the second parameter is the imaginary part of the electric signal or depends on the imaginary part of the electric signal.

4. The method according to claim 2, wherein the first parameter is an amplitude of the electric signal and the second parameter is a change of the amplitude and/or of the phase of the electric signal over time.

5. The method according to claim 2, wherein, depending on the variable, an expected range of values is defined for the first and the second parameter, which results from a functional correlation between the first and the second parameter, so that exactly one value of the second parameter is allocated to each value of the first parameter, wherein it is additionally tested whether or not the detected parameter appertains to this range of values.

6. The method according to claim 1, wherein, depending on the first and the second variable, expected minimum and/or maximum values are determined for two parameters, respectively.

7. The method according to claim 6, wherein the two parameters, the expected minimum and/or maximum values of which are determined depending on the first variable, are the real and the imaginary part of the electric signal, and/or the two parameters, the expected minimum and/or maximum values of which are determined depending on the second variable, are the change of the real and the imaginary part of the electric signal over time.

8. The method according to claim 1, wherein
   at least one further electronic appliance is provided, which is designed particularly analogous to the electronic appliance for determining the variable which is to be tested; and
   depending on the result of step e) the steps a) to f) are performed with the further electronic appliance.

9. The method according to claim 8, wherein, when the difference between a value of the parameter, determined with the electronic appliance which is to be tested, and a value of the parameter, determined at the same point in time with the further electronic appliance, exceeds a pre-determinable value, a circuit testing of the electronic appliance is initiated.

10. The method according to claim 1, wherein the sensor is designed for determining an occupancy of a vehicle seat by a vehicle occupant or in the form of a steering wheel sensor.

11. The method according to claim 10, wherein the variable, which can be registered by the sensor, is the amount of a shifting of a part of the vehicle seat, produced by the vehicle occupant while the vehicle occupant moves into or out of the vehicle seat.

12. The method according to claim 11, wherein the variable, which can be registered by the sensor, is a speed with which the vehicle occupant moves into, out of or on the vehicle seat.

13. The method according to claim 1, wherein the parameter denotes an amplitude, a frequency, an impedance or a phase of the electric signal or a change of these quantities.

14. A method for testing an electronic appliance for registering at least one variable of a system, wherein the electronic appliance is a sensor, the method including the steps:
  (a) Producing a first electric signal produced by means of a first reference circuit and a second electric signal produced by means of a second reference circuit, wherein the first and second reference circuits are configured differently than the electronic appliance which is to be tested;
  (b) Determining at least one first values of a first parameter of the first electric signal and at least one second value of a second parameter of the second electric signal;
  (c) Determining a difference between the first and the second value;
  (d) Defining an expected minimum and/or maximum value of the difference;
  (e) Testing whether the first and/or the second value is greater than the minimum value and smaller than the maximum value;
  Determining on the basis of the result from step e), whether there is a malfunction of the electronic appliance.

15. The method according to claim 14, wherein the first electric signal is produced by a first reference circuit and the second electric signal is produced by a second reference circuit, wherein the first and/or the second reference circuit is designed analogous to the electronic appliance which is to be tested and the minimum and/or maximum value of the parameter is defined depending on a defined minimum and/or maximum value of the variable.

16. A device for testing an electronic appliance for determining at least one variable of a system having
  a detector to detect a value of at least one parameter of an electric signal produced by the electronic appliance;
  a delineator to define an expected minimum and/or maximum value of the parameter depending on a minimum and/or a maximum value of the variable, which is determinable by means of the electronic appliance;
  an evaluator to test whether a value of the parameter, detected by the detector, is greater than the minimum value defined by the delineator and/or smaller than the maximum value;
  a determinator to determine on the basis of a signal of the testing means, whether there is a malfunction of the electronic appliance due to an interference field produced outside of the electronic appliance, wherein
  the device is configured to operate the evaluator based on a determined first variable,
  depending on whether the determinator determines there is a malfunction of the electronic appliance based on the determined first variable, the determinator determines whether there is a malfunction based on a determined second variable of the system and a second parameter, the second variable being different from the first variable,
  the delineator is configured to define a minimum and/or maximum value of the second parameter based on the defined minimum and/or maximum value of the second variable, and
  the detector, the delineator, the evaluator and the determinator perform their respective functions regarding the second variable only if a first parameter of the first variable is smaller than the minimum value or greater than the maximum value.

17. The device according to claim 16, wherein
  the delineator, the evaluator and the determinator are designed in the form of a programmed appliance, an ASIC or a combination of both.

18. A device for testing an electronic appliance for determining at least one variable of a system, the electronic appliance being a sensor and the device comprising:
  a signal generator comprising a first reference circuit to generate at least a first reference signal and a second reference circuit to generate a second reference signal, the first and second reference circuits being configured differently than the electronic appliance which is to be tested;
  a detector to detect a first value of at least one first parameter of the first electric signal and a second value of at least one second parameter of the second electric signal as well as a difference between the first and the second parameter;
  a delineator to define an expected minimum and/or maximum value of the difference between the first and the second value;
  an evaluator to test whether the difference is greater than the minimum value and smaller than the maximum value; and
  a determinator to determine on the basis of a signal of the evaluator, whether there is a malfunction of the electronic appliance.

* * * * *